US012745614B2

(12) United States Patent
Teng et al.

(10) Patent No.: US 12,745,614 B2
(45) Date of Patent: Sep. 22, 2026

(54) PROTECTION OF STI FEATURES

(71) Applicant: Taiwan Semiconductor Manufacturing Company, Ltd., Hsinchu (TW)

(72) Inventors: Yun Chen Teng, Taipei (TW); Sen-Hong Syue, Hsinchu (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 348 days.

(21) Appl. No.: 18/426,939

(22) Filed: Jan. 30, 2024

(65) Prior Publication Data

US 2025/0246478 A1 Jul. 31, 2025

(51) Int. Cl.

| | |
|---|---|
| ***H10W 10/00*** | (2026.01) |
| ***H10D 62/10*** | (2025.01) |
| ***H10P 50/00*** | (2026.01) |
| ***H10W 10/17*** | (2026.01) |

(52) U.S. Cl.

CPC ........ *H10W 10/014* (2026.01); *H10D 62/124* (2025.01); *H10P 50/692* (2026.01); *H10P 50/695* (2026.01); *H10W 10/17* (2026.01)

(58) Field of Classification Search

CPC .. H10W 10/014; H10W 10/17; H10D 62/124; H10D 30/019; H10D 30/501; H10D 84/0151; H10D 64/017; H10P 50/692; H10P 50/695; B82Y 10/00

See application file for complete search history.

(56) References Cited

U.S. PATENT DOCUMENTS

| | | | | |
|---|---|---|---|---|
| 2007/0249160 A1* | 10/2007 | Turner | H10P 14/6336 | 257/E21.628 |
| 2010/0304548 A1* | 12/2010 | Turner | H10P 90/1906 | 257/E21.546 |
| 2012/0187450 A1* | 7/2012 | Jakubowski | H10W 10/014 | 257/E21.409 |
| 2015/0137206 A1* | 5/2015 | Liu | H10P 50/642 | 438/266 |
| 2023/0155006 A1 | 5/2023 | Kao et al. | | |
| 2023/0197710 A1* | 6/2023 | Hsu | H10D 89/811 | 257/355 |
| 2023/0230883 A1* | 7/2023 | Yoshida | H10D 64/017 | 438/275 |

FOREIGN PATENT DOCUMENTS

| | | |
|---|---|---|
| TW | 202339002 A | 10/2023 |

* cited by examiner

*Primary Examiner* — Yasser A Abdelaziez

(74) *Attorney, Agent, or Firm* — Ingrassia Fisher & Lorenz, LLP | IF&L

(57) ABSTRACT

Semiconductor devices and methods for forming semiconductor devices are provided. A method includes forming a shallow trench isolation (STI) feature; forming a mask layer over the STI feature; depositing sacrificial material over the mask layer; and etching the sacrificial material to form sacrificial structures over the mask layer, wherein the mask layer prevents etching of the STI feature while etching the sacrificial material.

20 Claims, 17 Drawing Sheets

PROTECTION OF STI FEATURES

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multi-gate devices such as gate-all-around (GAA) FETs that use nanosheets are being used. FinFETs and multi-gate devices not only improve areal density, but also improve gate control of the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
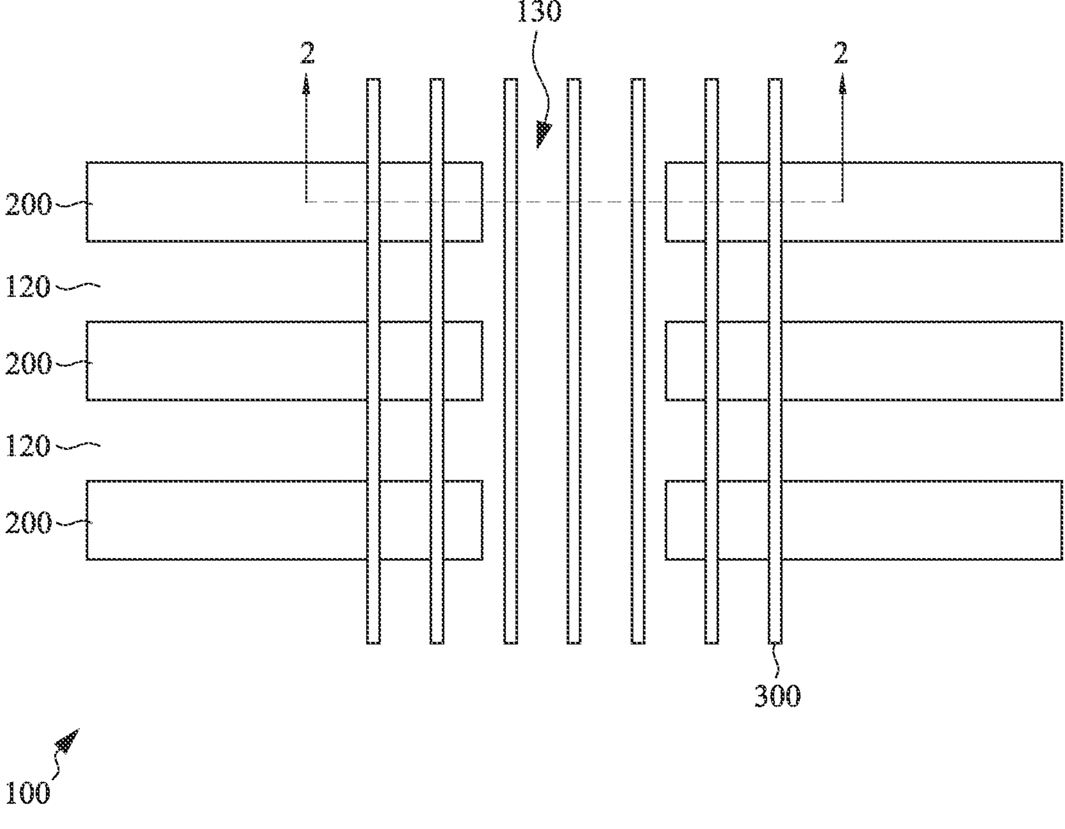
FIG. 1 is an overhead view of a semiconductor device during a stage of fabrication, in accordance with some embodiments.
Figure 1:
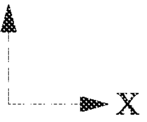

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. As used herein, "directly over" refers to a vertical alignment of features such that when an overlying feature that is directly over an underlying feature, a vertical axis passes through both features. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "directly over", "over", "overlying", "above", "upper", "top", "under", "underlying", "beneath", "below", "lower", "bottom", "side", "positive slope" and "negative slope" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

All numbers in this description indicating amounts, ratios of materials, physical properties of materials, and/or use are to be understood as modified by the word "about," except as otherwise explicitly indicated. When modifying a numerical value in the specification or claims, "about" denotes an interval of accuracy, familiar and acceptable to a person skilled in the art. In general, such interval of accuracy is ±ten percent. Thus, "about ten" means nine to eleven.

In certain embodiments herein, a "material layer" is a layer that includes at least 50 wt. % of the identified material, for example at least 60 wt. % of the identified material, or at least 75 wt. % of the identified material, or at least 90 wt. % of the identified material; and a layer that is a "material" includes at least 50 wt. % of the identified material, for example at least 60 wt. % of the identified material, at least 75 wt. % of the identified material, or at least 90 wt. % of the identified material. For example, certain embodiments, each of a titanium nitride layer and a layer that is titanium nitride is a layer that is at least 50 wt. %, at least 60 wt. %, at least 75 wt. %, titanium nitride, or at least 90 wt. % titanium nitride.

For the sake of brevity, well-known techniques related to semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Certain embodiments herein are generally related to FinFET or multi-gate transistors. Multi-gate transistors include those transistors whose gate structures are formed on at least two-sides of a channel region. These multi-gate devices may include a p-type metal-oxide-semiconductor device or an n-type metal-oxide-semiconductor multi-gate device. Specific examples may be presented and referred to herein as a gate-all-around (GAA) device. A GAA device includes any device that has its gate structure, or portion thereof, formed on 4-sides of a channel region (e.g., surrounding a portion of a channel region).

Structures presented herein also include embodiments that have channel regions in the form of nanosheets. The term "nanosheet" designates any material portion with nanoscale, or even microscale dimensions, and having an elongated shape, regardless of the cross-sectional shape of this portion. Thus, this term designates both circular and substantially circular cross-section elongated material portions, e.g., nanowires, and beam or bar-shaped material portions including for example a cylindrical or substantially rectangular cross-section.

As described herein, a method is provided to protect a shallow trench isolation (STI) feature during etching processes. For example, a hard mask layer may be formed over or may be formed from the STI feature. Thereafter, a sacrificial material may be deposited over the hard mask and etched to form sacrificial structures. Due to the presence of the hard mask layer, the underlying STI feature is not etched during etching of the sacrificial material, or is only slightly etched.

Certain embodiments selectively form a hard mask on STI (shallow trench isolation), such as a silicon oxide ($SiO_2$) STI feature. The hard mask serves as a protection layer to prevent STI oxide loss during downstream, i.e., later, etch processes, such as HR clean and dry etch processes in a poly/EPI loop. Specifically, the hard mask has stronger wet/dry etch resistance, as compared to the STI feature material.

The methods for the STI hard mask formation may include selective deposition of an N-containing dielectric layer, selective deposition of a dielectric layer followed by nitridation of the dielectric layer, or selective nitridation of the STI oxide.

After STI hard mask formation, the poly line stands on the STI hard mask rather than on an oxide layer. As a result, significant loss of STI feature material is avoided, and, as a result, poly line collapse that results from STI feature material loss is avoided. Such poly line collapse would otherwise degrade electrical performance and yield.

It is noted that while the Figures and description recite the structure of a gate-all-around (GAA) device, it is contemplated that the methods described herein may be used to fabricate other types of devices, and that the devices described herein may be other types of devices.

For purposes of the discussion that follows, FIG. 1 provides an overhead layout view of a semiconductor device 100 during an intermediate stage of fabrication. As shown, the semiconductor device 100 includes raised structures 200 or fins 200. Parallel fins 200 extend in the X-direction and a spaced apart from one another in the Y-direction by gaps 120. Further, each fin 200 is separated in the X-direction from an adjacent fin 200 by a cavity or trench 130.

During the intermediate stage of fabrication shown in FIG. 1, sacrificial structures 300, such as sacrificial gates 300 or polysilicon structures 300, are formed over the fins 200 and over the trench 130. Parallel sacrificial gates 300 extend in the Y-direction and are spaced from one another in the X-direction.

Figure 2:
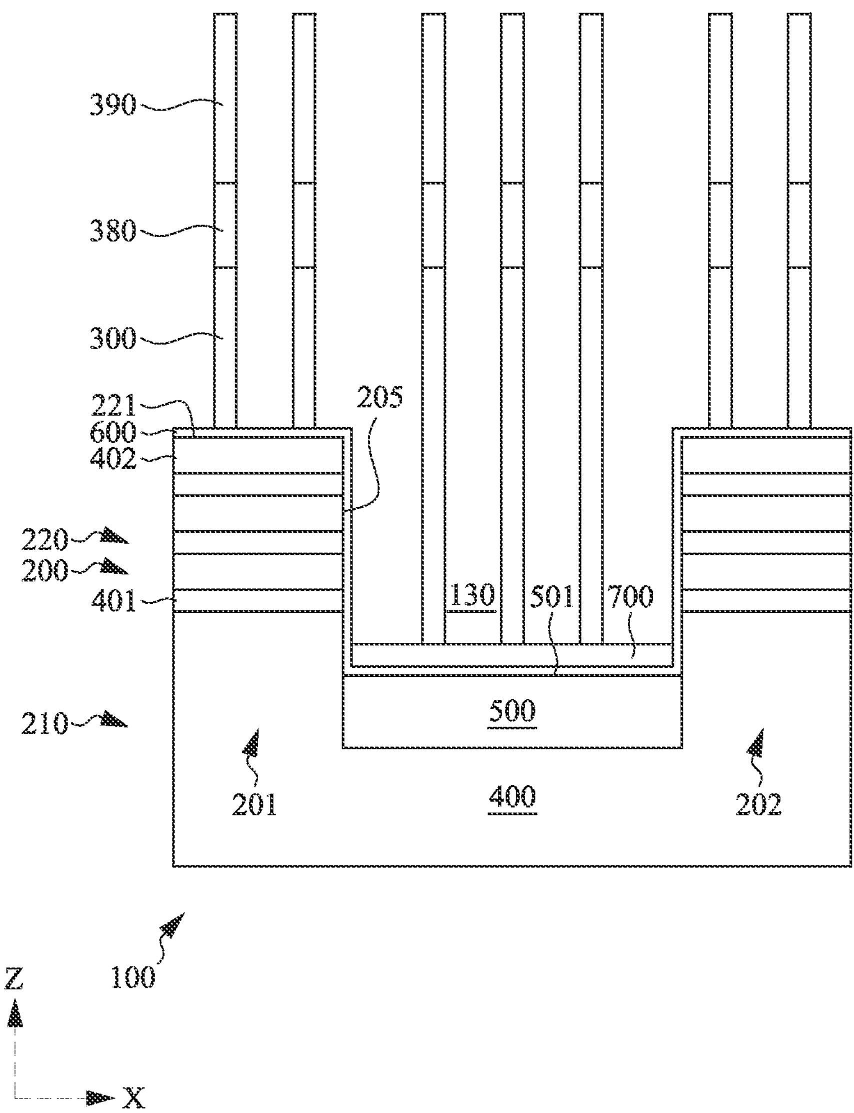
FIG. 2 is a cross-sectional view of the semiconductor device of FIG. 1, taken along line 2-2.

Referring now to FIG. 2, a cross-sectional view of the semiconductor device 100 at the intermediate stage of fabrication of FIG. 1 is shown, taken along line 2-2 in FIG. 1.

As shown in FIG. 2, the fins 200 are formed from an underlying semiconductor substrate 400 and from alternating semiconductor layers 401 and 402 formed over the semiconductor substrate 400. Thus, the fins 200 include a mesa or bottom portion 210 and nanosheet or upper portion 220. Further, the fins 200 are formed with substantially vertical end walls 205. Also, the fins 200 have an uppermost surface 221.

The trench 130 extends from the end wall 205 of a first adjacent fin 201 to the end wall 205 of a second adjacent fin 202.

As shown in FIG. 2, a shallow trench isolation (STI) feature 500 is formed in the trench 130 and extends from the end wall 205 of the first adjacent fin 201 to the end wall 205 of the second adjacent fin 202. The STI feature 500 has an uppermost surface 501.

As shown in FIG. 2, a capping layer 600, such as an oxide layer 600, is formed over the uppermost surface 221 of the fins 200, along the end wall 205 of the fins 200, and over the uppermost surface 501 of the STI feature 500.

As shown in FIG. 2, a hard mask 700 is formed over the oxide layer 600 overlying the uppermost surface 501 of the STI feature 500, i.e., in the trench 130.

As shown in FIG. 2, sacrificial gates 300 are formed over the fins 200 and over the STI feature 500. Over the fins 200, the sacrificial gates 300 are located directly on the oxide layer 600. Over the STI feature 500, the sacrificial gates 300 are located directly on the hard mask 700.

As shown in FIG. 2, a first gate mask 380 and second gate mask 390 may be located over the sacrificial gates 300.

Figure 3:
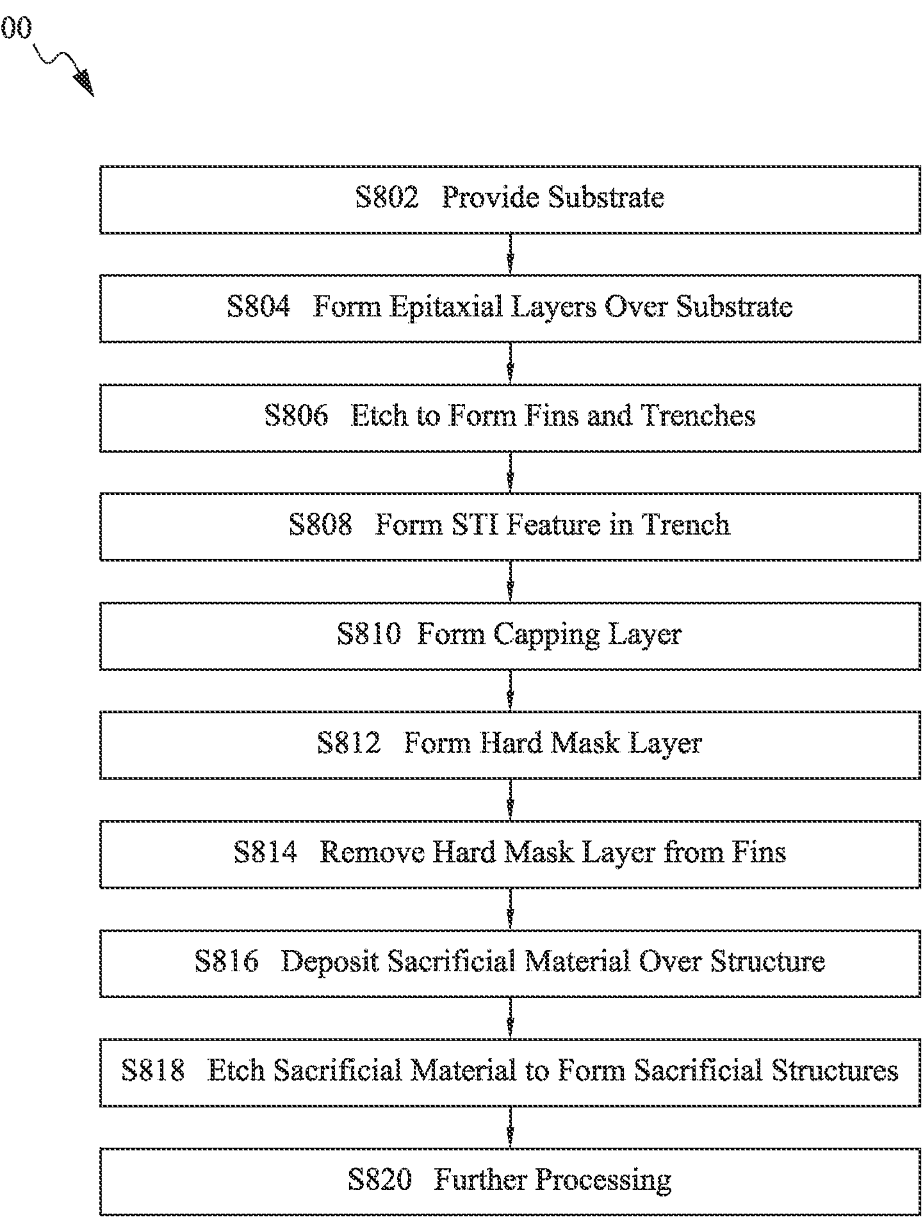
FIG. 3 is a flow chart illustrating a method, in accordance with some embodiments.

FIG. 3 provides a flow chart illustrating a method 800 for fabricating the semiconductor device 100. FIG. 3 is described in conjunction with FIGS. 1-2 and 4-12 which illustrate a semiconductor device 100 at various stages of fabrication in accordance with some embodiments of the present disclosure of the method 800. The method 800 is merely an example, and is not intended to limit the present disclosure beyond what is explicitly recited in the claims. Additional steps may be provided before, during, and after method 800, and some of the steps described can be moved, replaced, or eliminated for additional embodiments of method 800. Additional features may be added in the semiconductor device depicted in the Figures and some of the features described below can be replaced, modified, or eliminated in other embodiments of the semiconductor device.

As with the other method embodiments and devices discussed herein, it is understood that parts of the semiconductor device 100 may be fabricated by typical semiconductor technology process flow, and thus some processes are only briefly described herein. Further, the semiconductor devices may include various other devices and features, such as other types of devices such as additional transistors, bipolar junction transistors, resistors, capacitors, inductors, diodes, fuses, and/or other logic devices, etc., but is simplified for a better understanding of concepts of the present disclosure. In some embodiments, the devices include a plurality of semiconductor devices (e.g., transistors), including PFETs, NFETs, etc., which may be interconnected. Moreover, it is noted that the process steps of method 800, including any descriptions given with reference to the Figures, as with the remainder of the method and figures provided in this disclosure, are merely illustrative and are not intended to be limiting beyond what is specifically recited in the claims that follow.

Figure 4:
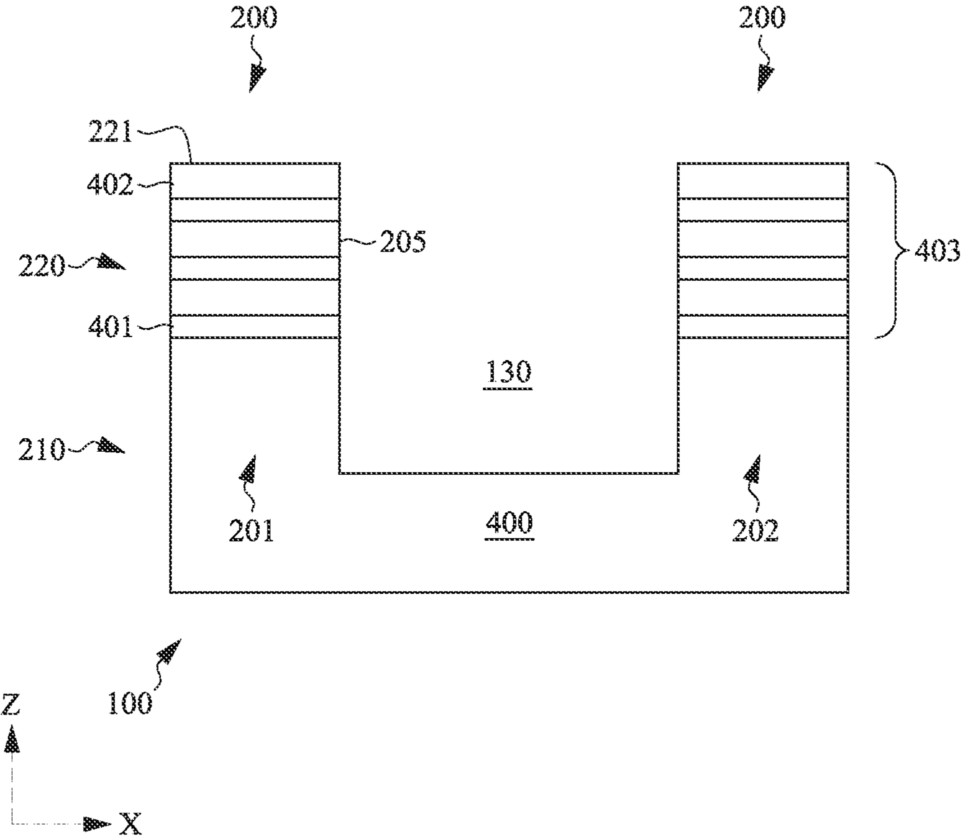
FIGS. 4-10 are cross-sectional views of the semiconductor device of FIG. 2 at successive stages of fabrication.

At operation S802, the method 800 (FIG. 3) provides a substrate 400, as shown in FIG. 4. In some embodiments, the substrate 400 may be a semiconductor substrate such as a silicon (Si) substrate. The substrate 400 may include various layers, including conductive or insulating layers formed on a semiconductor substrate. The substrate 400 may include various doping configurations depending on design requirements as is known in the art. For example, different doping profiles (e.g., p-well, n-well) may be formed on the substrate 400 in regions designed for different device types (e.g., n-type field effect transistors (NFET), p-type field effect transistors (PFET)). The suitable doping may include ion implantation of dopants and/or diffusion processes, such as boron (B) for the p-well and phosphorous (P) for the n-well. In some embodiments, the substrate 400 includes a single crystalline semiconductor layer on at least its surface portion. The substrate 400 may comprise a single crystalline semiconductor material such as, but not limited to Si, Ge, SiGe, GaAs, InSb, GaP, GaSb, InAlAs, InGaAs, GaSbP, GaAsSb and InP. Alternatively, the substrate 400 may include a compound semiconductor and/or an alloy semiconductor. In the illustrated embodiment, the substrate 400 is made of crystalline Si.

As shown in FIG. 4, at operation S804, the method 800 (FIG. 3) forms one or more epitaxial layers over the substrate 400. In some embodiments, an epitaxial stack 403 is formed over the substrate 400. The epitaxial stack 403 includes epitaxial layers 401 of a first composition interposed by epitaxial layers 402 of a second composition. The first and second composition may be different. Embodiments are possible including those that provide for a first composition and a second composition having different oxidation rates and/or etch selectivity. In an embodiment, the epitaxial layers 401 are SiGe and the epitaxial layers 402 are silicon. In embodiments wherein the epitaxial layer 401 includes SiGe and the epitaxial layer 402 includes silicon, the silicon oxidation rate is less than the SiGe oxidation rate. It is noted that three layers of epitaxial layers 401 and three layers of epitaxial layers 402 are illustrated in the Figures, which is for illustrative purposes only and not intended to be limiting beyond what is specifically recited in the claims. It can be appreciated that any number of epitaxial layers may be formed in the epitaxial stack 403; the number of layers depending on the desired number of channels regions for the device 100. In some embodiments, the number of epitaxial layers 402 is between two and ten, such as six or seven.

In some embodiments, the epitaxial layer 401 has a thickness ranging from about 5 nm to about 15 nm. The epitaxial layers 401 may be substantially uniform in thickness. In some embodiments, the epitaxial layer 402 has a thickness ranging from about 5 nm to about 15 nm. In some embodiments, the epitaxial layers 402 of the stack are substantially uniform in thickness. As described in more detail below, the epitaxial layer 402 may serve as channel region(s) for a subsequently formed multi-gate device and has a thickness chosen based on device performance considerations. The epitaxial layer 401 may serve to define a gap between adjacent channel region(s) for a subsequently formed multi-gate device and has a thickness chosen based on device performance considerations.

By way of example, epitaxial growth of the epitaxial stack 403 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 402 include the same material as the substrate 400. In some embodiments, the epitaxially grown layers 401 and 402 include a different material than the substrate 400. As stated above, in at least some examples, the epitaxial layer 401 includes an epitaxially grown $Si_{1-x}Ge_x$ layer (wherein x is from about 10 to about 55%) and the epitaxial layer 402 includes an epitaxially grown silicon (Si) layer. Alternatively, in some embodiments, either of the epitaxial layers 401 and 402 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 401 and 402 may be chosen based on providing differing oxidation, etch selectivity properties. In various embodiments, the epitaxial layers 401 and 402 are substantially dopant-free (i.e., having an extrinsic dopant concentration from about 0 $cm^{-3}$ to about $1\times10^{17}$ $cm^{-3}$), where for example, no intentional doping is performed during the epitaxial growth process. In some embodiments, the bottom layer and the top layer of the epitaxial stack 403 are SiGe layers (not shown). In alternative embodiments, the bottom layer of the epitaxial stack 403 is a Si layer and the top layer of the epitaxial stack 403 is a SiGe layer (not shown).

As shown in FIG. 4, at operation S806, the method 800 (FIG. 3) patterns the epitaxial stack 403 to form semiconductor fins 200 and trenches 130. In some embodiments, the operation S806 includes forming a mask layer (not shown) over the epitaxial stack 403. The mask layer may include a first mask sublayer and a second mask sublayer. A certain first mask sublayer is a pad oxide layer made of a silicon oxide, which may be formed by a thermal oxidation. A certain second mask sublayer is made of a silicon nitride (SiN), which may be formed by chemical vapor deposition (CVD), including low pressure CVD (LPCVD) and plasma enhanced CVD (PECVD), physical vapor deposition (PVD), atomic layer deposition (ALD), or other suitable process. The mask layer is patterned into a mask pattern by using patterning operations including photolithography and etching. Operation S806 subsequently patterns the epitaxial stack 403 in an etching process, such as a dry etch (e.g., reactive ion etching), a wet etch, and/or other suitable process, through openings defined in the patterned mask layer. The stacked epitaxial layers 401 and 402 are thereby patterned into the fin 200. The process for forming fins 200 may result in the formation of gaps between parallel fins 200 and trenches between adjacent fins 201 and 202.

In various embodiments, each fin 200 includes an upper portion 220 of the interleaved epitaxial layers 401 and 402, and a bottom portion 210 that is formed from the etched substrate 400. Each fin 200 protrudes upwardly in the Z-direction from the substrate 400 and extends lengthwise in the X-direction. Sidewalls of each fin 200 may be straight or inclined (not shown). The fins 200 may have a same width or different widths.

Figure 5:
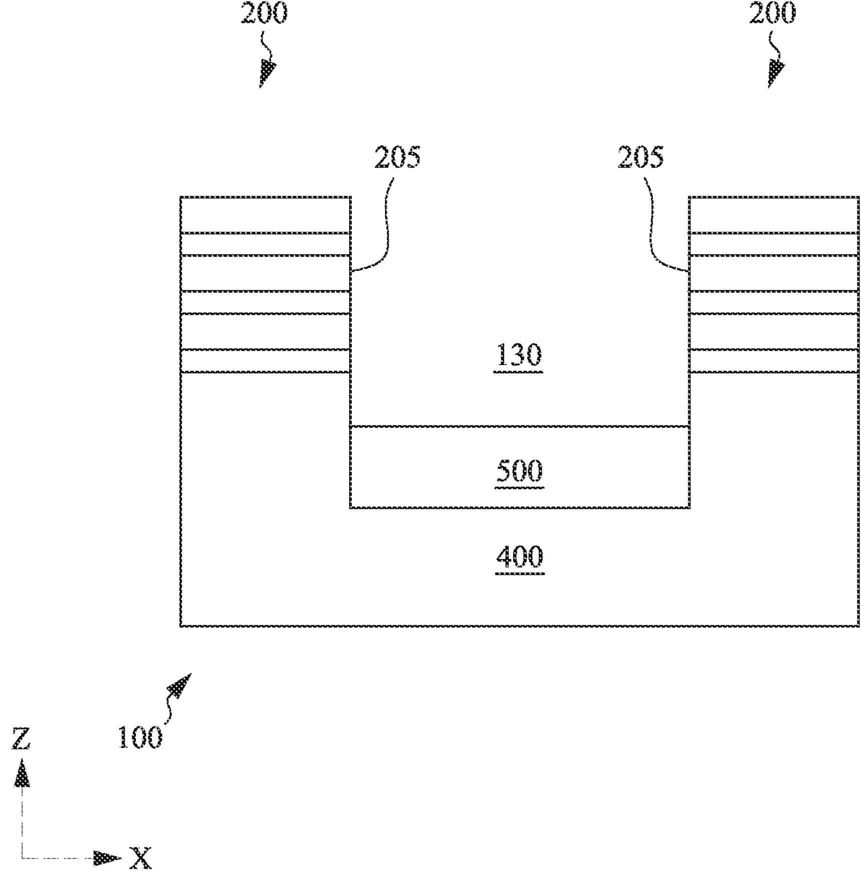

As shown in FIG. 5, at operation S808, the method 800 (FIG. 3) forms shallow trench isolation (STI) features (also denoted as STI features) 500 in trenches 130 adjacent to each fin 200 with a dielectric layer. Each STI feature 500 contacts the end wall 205 of each adjacent fin 200. The STI features 500 may be formed by first filling the trenches 130 around each fin 200 with a dielectric material layer to cover top surfaces and sidewalls of the fin 200 (not shown). The dielectric material layer may include one or more dielectric materials. The dielectric material layer may include silicon oxide ($SiO_2$). Suitable dielectric materials for the dielectric layer may include silicon oxides, silicon nitrides, silicon carbides, fluorosilicate glass (FSG), low-K dielectric materials, and/or other suitable dielectric materials. The dielectric material may be deposited by any suitable technique including thermal growth, flowable CVD (FCVD), HDP-CVD, PVD, ALD, and/or spin-on techniques. The dielectric material layer is then planarized by using, for example, chemical mechanical planarization (CMP), until top surfaces of the mask layer (not shown) are revealed, and the dielectric material layer is recessed to form the shallow trench isolation (STI) features (also denoted as STI features) 500, as shown in FIG. 5. In the illustrated embodiment, the STI features 500 are formed on the substrate 400. Any suitable etching technique may be used to recess the isolation features 500 including dry etching, wet etching, RIE, and/or other etching methods, and in an embodiment, an anisotropic dry etching is used to selectively remove the dielectric material of the isolation features 500 without etching the fin 200. The mask layer (not shown) may also be removed before, during, and/or after the recessing of the isolation features 500. In some embodiments, the mask layer is removed by the CMP process performed prior to the recessing of the isolation features 500. In some embodiments, the mask layer is removed by an etchant used to recess the isolation features 500.

Figure 6:
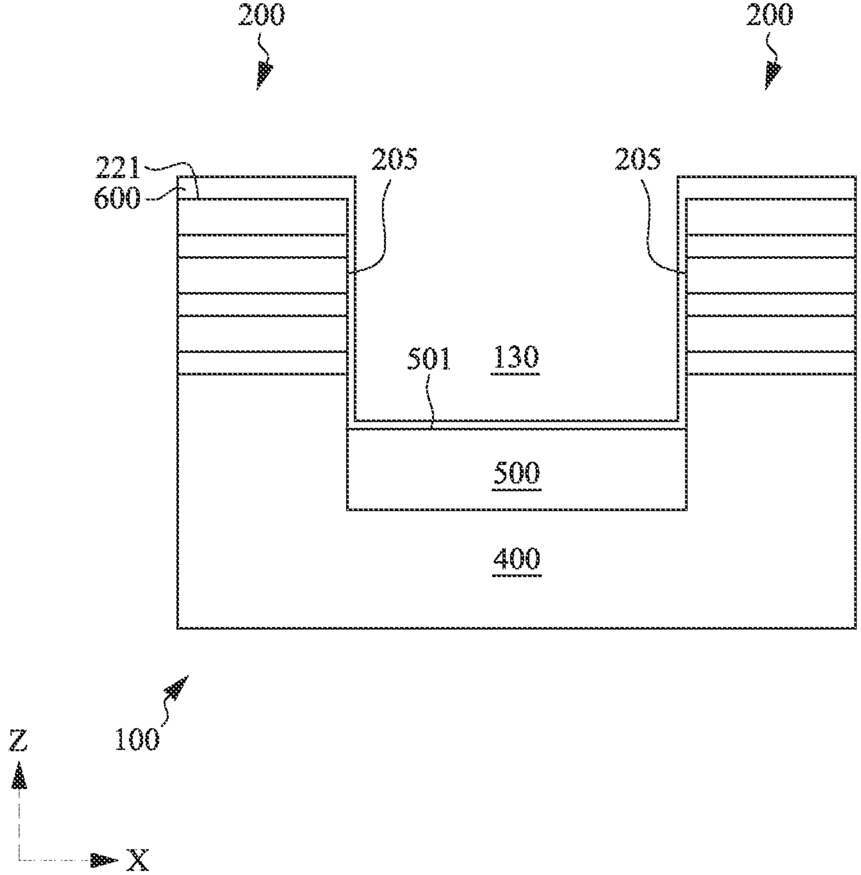

As shown in FIG. 6, at operation S810, the method 800 (FIG. 3) optionally forms a capping layer 600, such as an oxide layer 600, i.e., a silicon oxide layer 600, over the fins 200 and the shallow trench isolation (STI) feature 500. As shown, the oxide layer 600 contacts the uppermost surface 221 of the fins 200, the end wall 205 of the fins 200, and the uppermost surface 501 of the STI feature 500.

Figure 7:
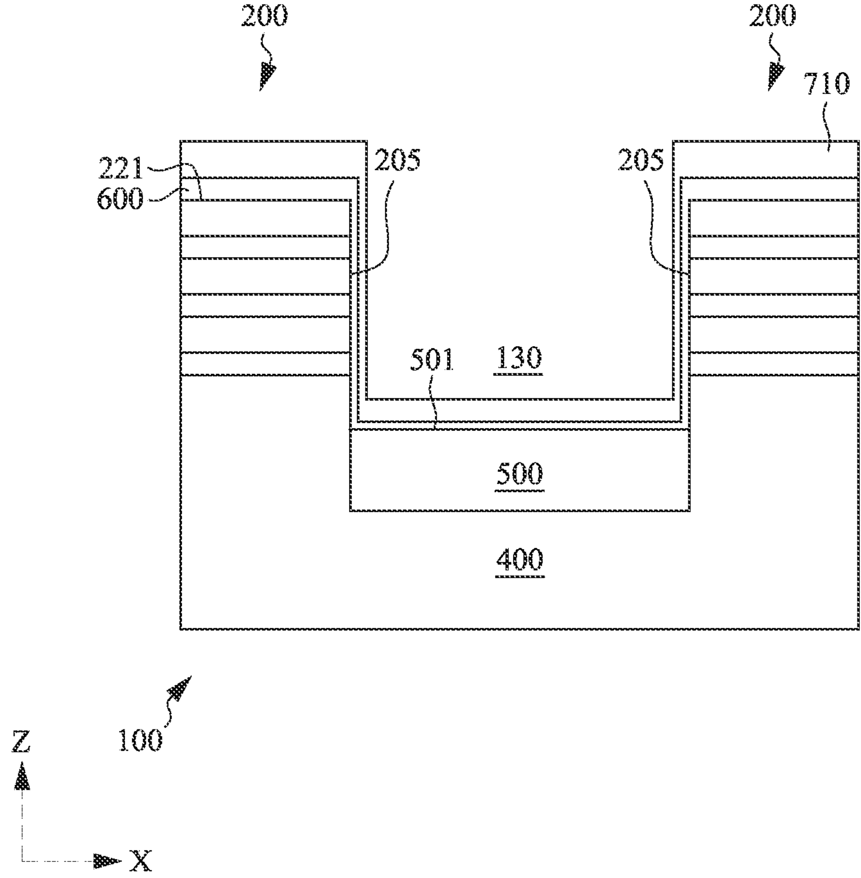

As shown in FIG. 7, at operation S812, the method 800 (FIG. 3) forms a hard mask layer 710 over the capping layer 600. In the embodiment of FIG. 7, the hard mask layer 710 is deposited as a nitrogen-containing dielectric material. For example, the hard mask layer 710 is deposited as a nitrogen-containing dielectric material selected from $SiC_xN_{1-x}$, $SiO_xN_{1-x}$, $SiO_xC_yN_{1-x-y}$, $SiN_x$, or other low-k film material. In embodiments, the hard mask layer 710 is deposited via an anisotropic deposition process with bias function to selectively deposit the material on capping layer 600 over the uppermost surface 221 of the fins 200 and over the uppermost surface 501 of the STI feature 500 while limiting deposition on the capping layer 600 on the end walls 205, such that the thickness of the hard mask layer 710 along the end walls 205 is less than the thickness of the hard mask layer 710 over the uppermost surfaces 221 and 501. In certain embodiments, the hard mask layer 710 is not formed along the end walls 205.

Figure 8:
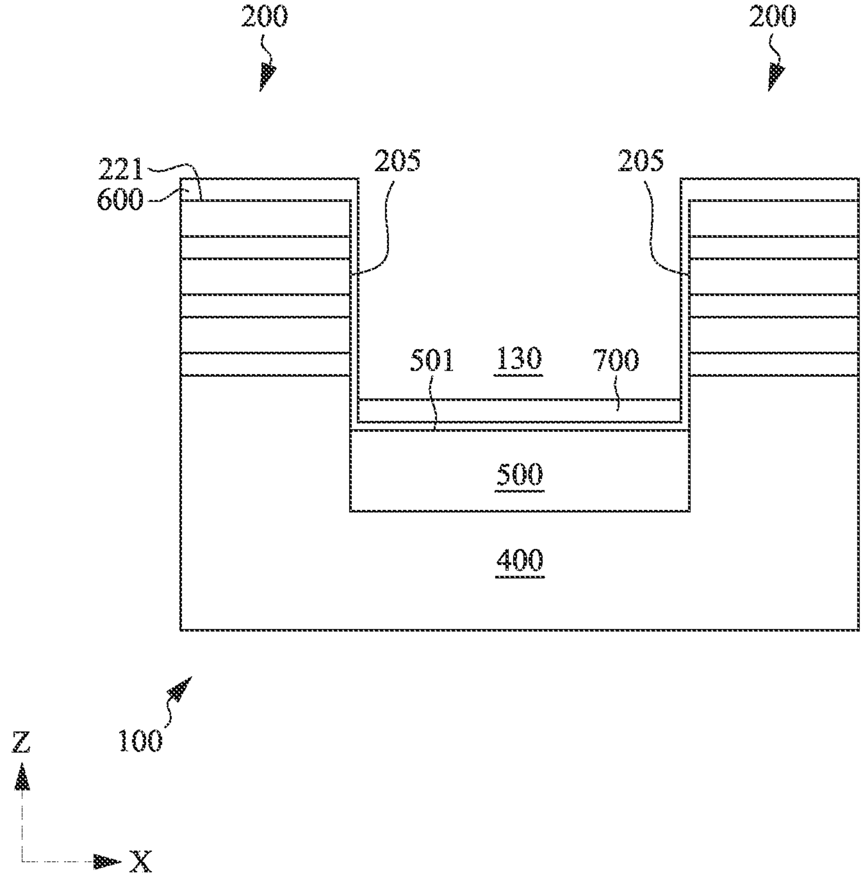

As shown in FIG. 8, at operation S814, the method 800 (FIG. 3) removes the hard mask layer 710 from over the fin uppermost surfaces 221 and along the end walls 205. As a result, the hard mask 700 is defined over the STI feature 500 and within the trench 130. In certain embodiments, the hard mask 700 has a thickness, in the Z-direction, of from 0 to 20 nanometers (nm). For example, the hard mask thickness may be at least 0.1 nm, at least 0.5 nm, at least 1 nm, at least 2 nm, at least 5 nm, at least 10 nm, or at least 15 nm. Further, the hard mask thickness may be no more than 20 nm, such as no more than 15 nm, no more than 10 nm, no more than 6 nm, no more than 5 nm, no more than 4 nm, no more than 2 nm, or no more than 1 nm.

Figure 9:
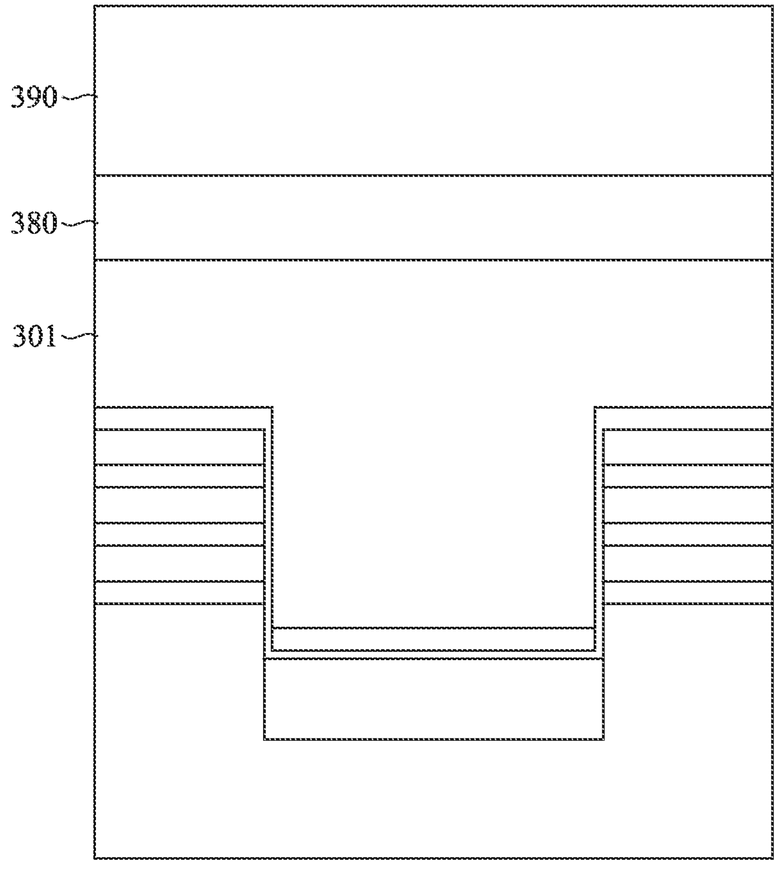
Figure 9:
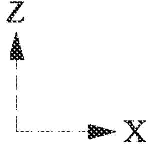

As shown in FIG. 9, at operation S816, the method 800 (FIG. 3) deposits sacrificial material 301 over the device 100. In certain embodiments, the sacrificial material 301 may include a sacrificial gate dielectric material and a sacrificial gate electrode material. Thus, operation S816 may include first blanket depositing a sacrificial gate dielectric layer. The sacrificial gate dielectric layer includes silicon oxide, silicon nitride, or a combination thereof. The thickness of the sacrificial gate dielectric layer is in a range from about 1 nm to about 5 nm in some embodiments.

A sacrificial gate electrode layer is then blanket deposited on the sacrificial gate dielectric layer. The thickness of the sacrificial gate electrode layer is in a range from about 100 nm to about 200 nm in some embodiments. The sacrificial gate electrode layer includes silicon such as polycrystalline silicon or amorphous silicon. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process.

Figure 10:
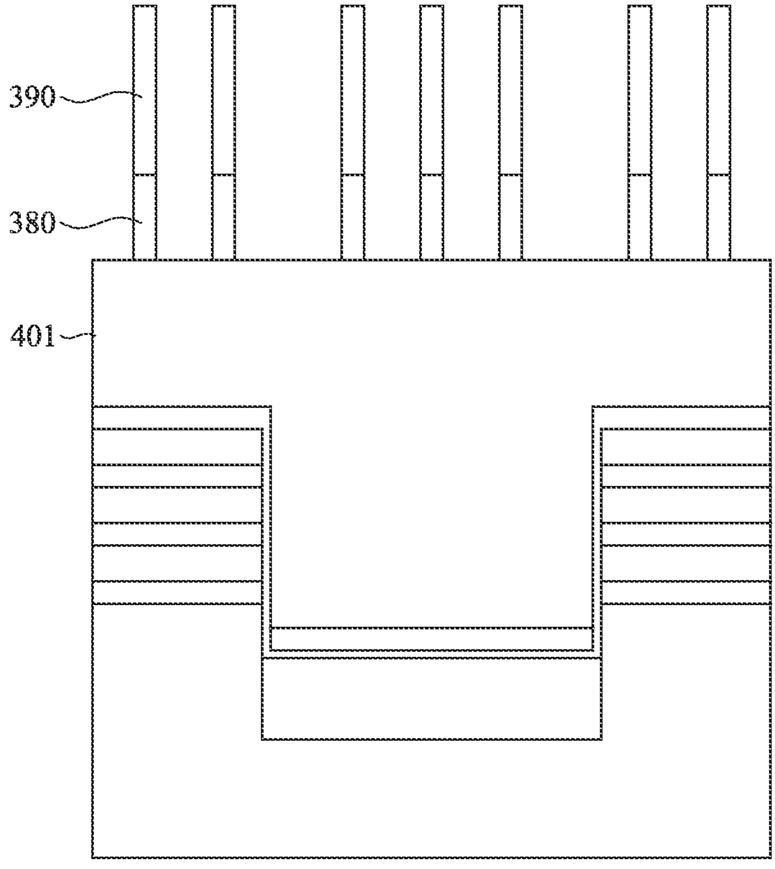
Figure 10:
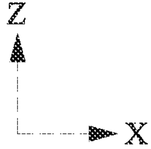

Further, a gate mask 380 and a gate mask 390 are formed over the sacrificial material 301. The gate mask 380 may be silicon oxide and gate mask 390 may be silicon nitride. As shown in FIG. 10, the gate masks 380 and 390 are patterned and etched.

Referring back to FIG. 2, at operation S818, the method 800 (FIG. 3) etches the sacrificial material to form the sacrificial structures 300 as illustrated.

Method 800 may then continue at operation S820 with further processing. For example, spacers may be formed, source/drain regions may be defined and formed, the sacrificial gate structures may be removed and replaced by metal gate structures, additional dielectric and conductive layers may be formed and patterned, and typical back-end-of-line (BEOL) processing may be performed.

Figure 18:
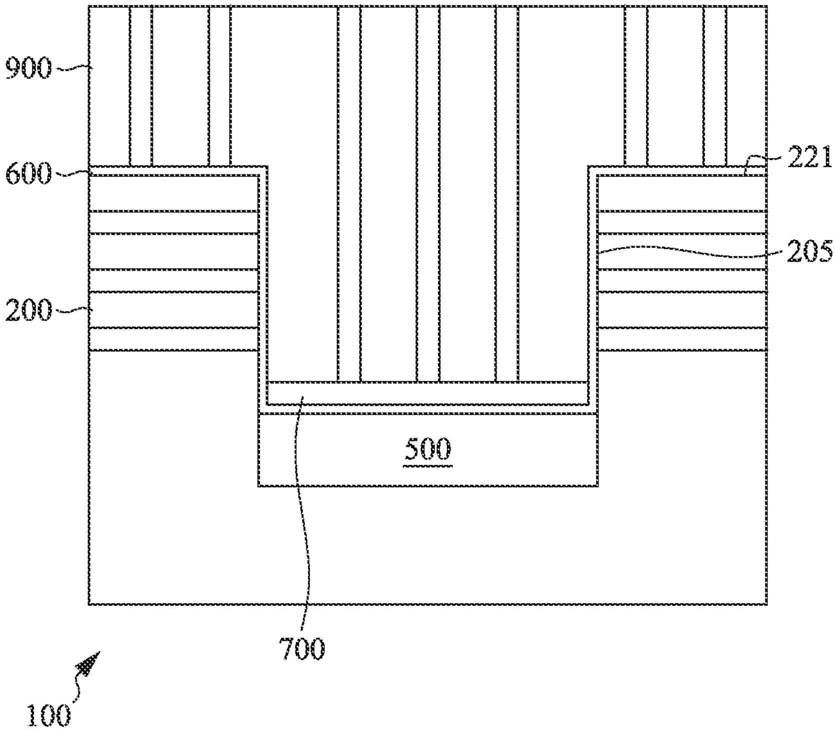

As shown in FIG. 18, further processing may include forming a dielectric layer or layers 900, such as an interlayer dielectric (ILD) or pre-metal dielectric (PMD) material over the device 100. As shown, a portion of the dielectric layer 900 is located within the trench 130 and may directly contact the hard mask 700. In embodiments including the optional capping layer 600, the capping layer 600 separates the dielectric layer 900 from the end walls 205 and uppermost surface 221 of the fins 200. In embodiments in which the capping layer 600 is not formed, the dielectric layer 900 may contact the end walls 205 and the uppermost surface 221 of the fins 200.

As noted above, operation S812 forms a hard mask layer 710 over the capping layer 600. With respect to FIG. 7, operation S812 is described as being performed by depositing a nitrogen-containing dielectric material. However, other embodiments may perform operation S812 in a different manner.

Figure 11:
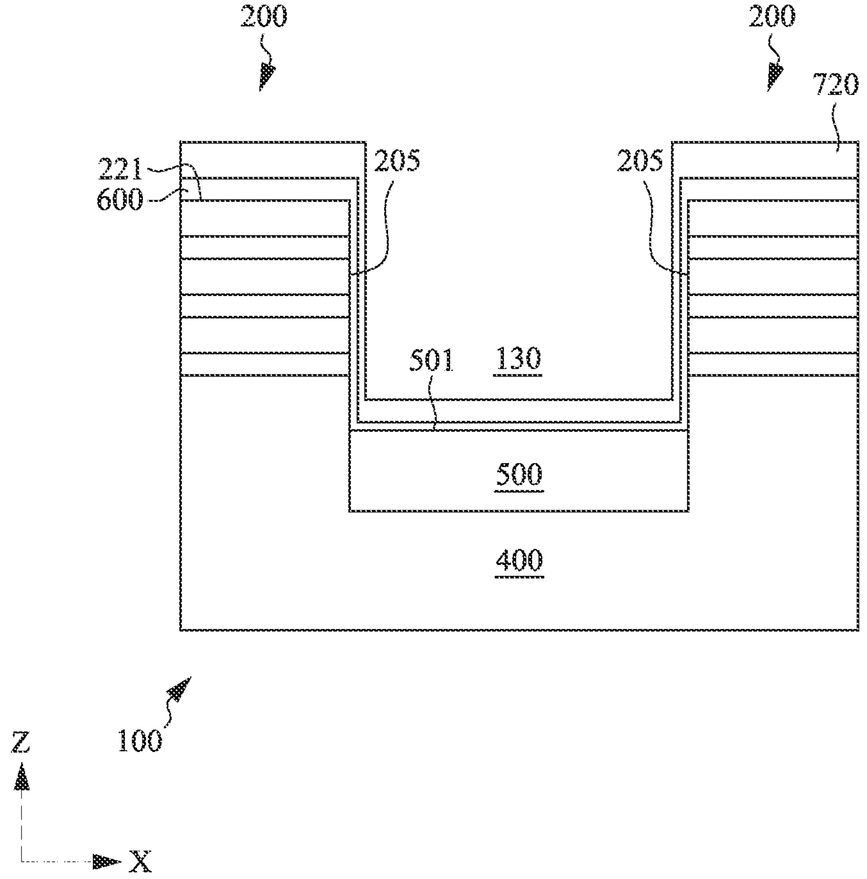
FIGS. 11-12 are cross-sectional views of an alternative embodiment of the semiconductor device of FIG. 2 at successive stages of fabrication.

For example, in FIG. 11, at operation S812, the method 800 (FIG. 3) forms a hard mask layer 710 over the capping layer 600 by first depositing a dielectric material 720 that does not include nitrogen. The dielectric material 720 may be selected from SiC, SiO, $SiO_xC_y$, Si, or other low-k film material. In embodiments, the dielectric material 720 is deposited via an anisotropic deposition process with bias function to selectively deposit the material on capping layer 600 over the uppermost surface 221 of the fins 200 and over the uppermost surface 501 of the STI feature 500 while limiting deposition on the capping layer 600 on the end walls 205, such that the thickness of the dielectric material 720 along the end walls 205 is less than the thickness of the dielectric material 720 over the uppermost surfaces 221 and 501. In certain embodiments, the dielectric material 720 is not formed along the end walls 205.

Figure 12:
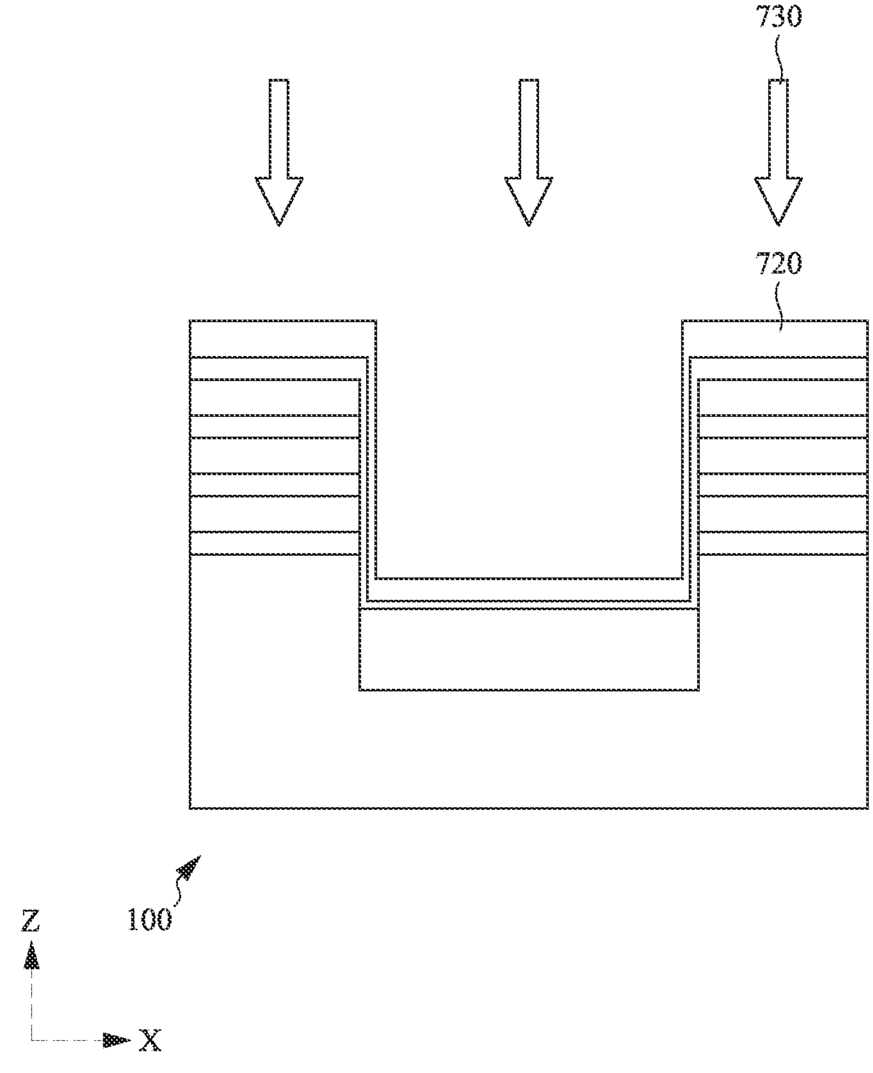

Further, operation S812 includes, at FIG. 12, performing a nitridation process to nitridated the dielectric material 720. The nitridation process may be nitrogen implant process or a nitridation anneal process. For example, nitrogen ions 730 may be implanted into the dielectric material 720. A nitrogen implant process may be performed with an energy of from 500 eV to 10 keV, with a dosage of from 1E15 to 1E17 atom/cm2, and at a temperature of from −100 to 500° C. A nitridation anneal process may be performed with an anneal gas selected from $NH_3$, $N_2$, $N_2$+$H_2$, $N_2O$, $NH_3$ radical, $N_2$ radical, $N_2$+$H_2$ radical, $N_2O$ radical or a mixture thereof, at a temperature of from 100 to 1400 C, and at a pressure of from 0.01 to 25 atm.

As a result of the nitridation process of FIG. 12, the device 100 is formed with the structure of FIG. 7 as described above, and the method may continue at operation S814.

As noted above, operation S810 for forming a capping layer 600 is optional. In certain embodiments, no capping layer 600 is formed. Further, in such embodiments, operation S812 may form a hard mask layer 710 without depositing any additional layer.

Figure 13:
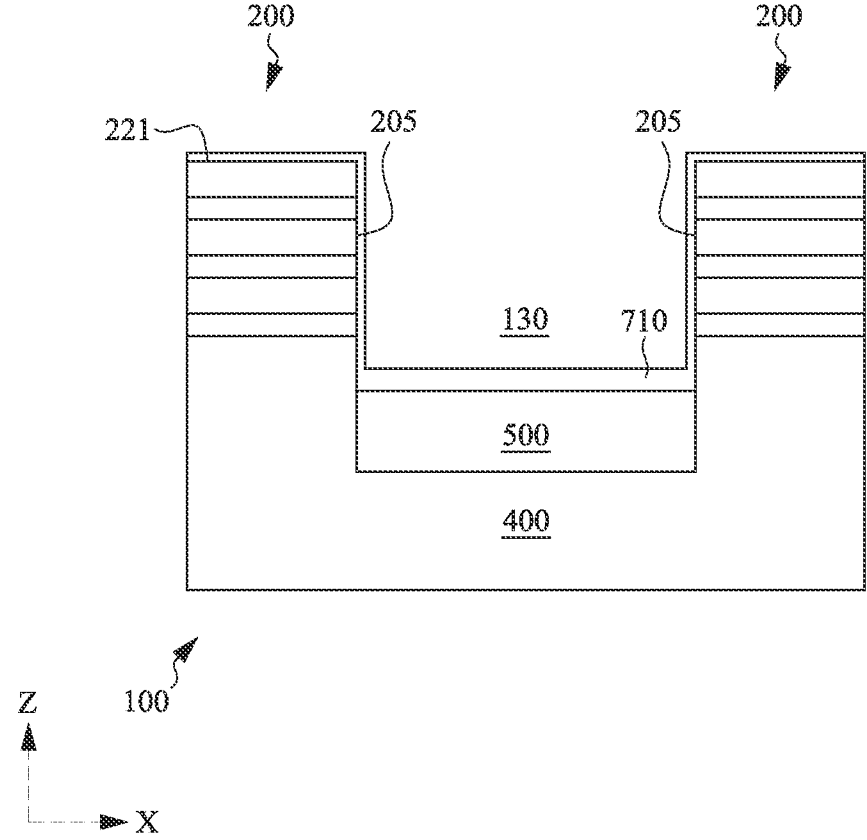
FIGS. 13-15 are cross-sectional views of an alternative embodiment of the semiconductor device of FIG. 2 at successive stages of fabrication.

Specifically, as shown in FIG. 13, the structure of the device 100 of FIG. 5 may be processed at operation S812 to form the hard mask layer 710 by performing a nitridation process to nitridate the uppermost surface 221 of the fins, the end walls 205 of the fins 200, and the uppermost surface 501 of the STI feature 500. The nitridated portions of the fins 200 and the STI feature 500 form the hard mask layer 710.

The nitridation process may be nitrogen implant process or a nitridation anneal process. A nitrogen implant process may be performed with an energy of from 500 eV to 10 keV, with a dosage of from 1E15 to 1E17 atom/cm2, and at a temperature of from −100 to 500° C. A nitridation anneal process may be performed with an anneal gas selected from $NH_3$, $N_2$, $N_2$+$H_2$, $N_2O$, $NH_3$ radical, $N_2$ radical, $N_2$+$H_2$ radical, $N_2O$ radical or a mixture thereof, at a temperature of from 100 to 1400 C, and at a pressure of from 0.01 to 25 atm.

Figure 14:
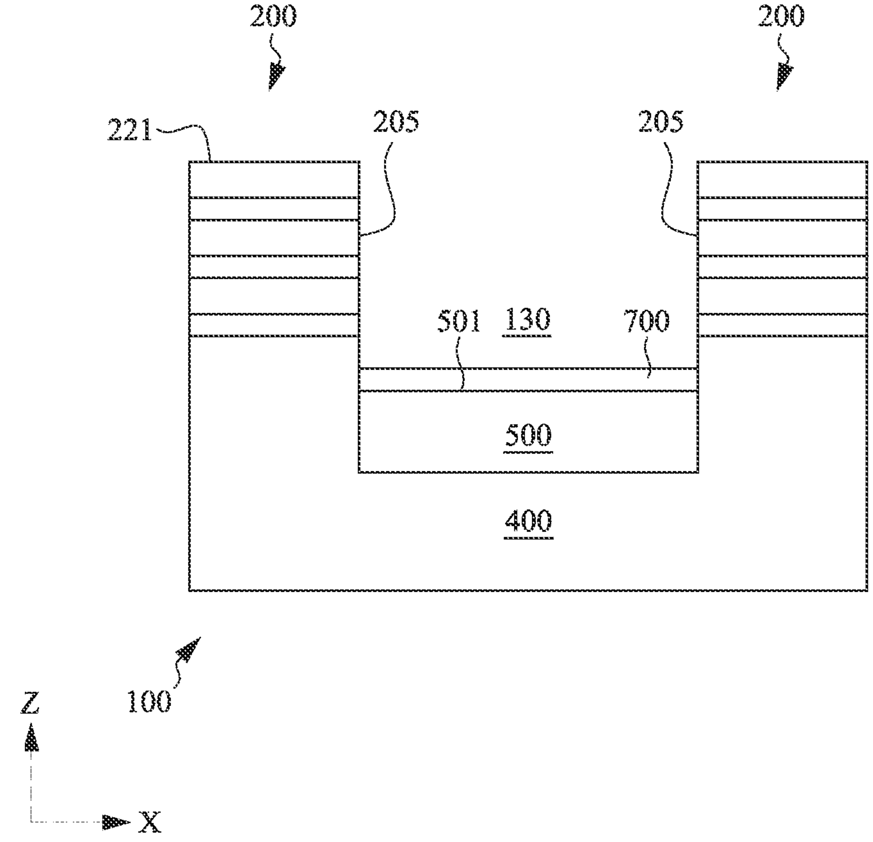

FIG. 14 illustrates the structure of the embodiment of FIG. 13 after operation S814 removes the hard mask layer 710 from over the fin uppermost surfaces 221 and along the end walls 205. As a result, the hard mask 700 is defined over the STI feature 500 and within the trench 130. In certain embodiments, the hard mask 700 has a thickness, in the Z-direction, of from 0 to 20 nanometers (nm). For example, the hard mask thickness may be at least 0.1 nm, at least 0.5 nm, at least 1 nm, at least 2 nm, at least 5 nm, at least 10 nm, or at least 15 nm. Further, the hard mask thickness may be no more than 20 nm, such as no more than 15 nm, no more than 10 nm, no more than 6 nm, no more than 5 nm, no more than 4 nm, no more than 2 nm, or no more than 1 nm. In FIG. 14, the optional capping layer 600 is not present.

Figure 15:
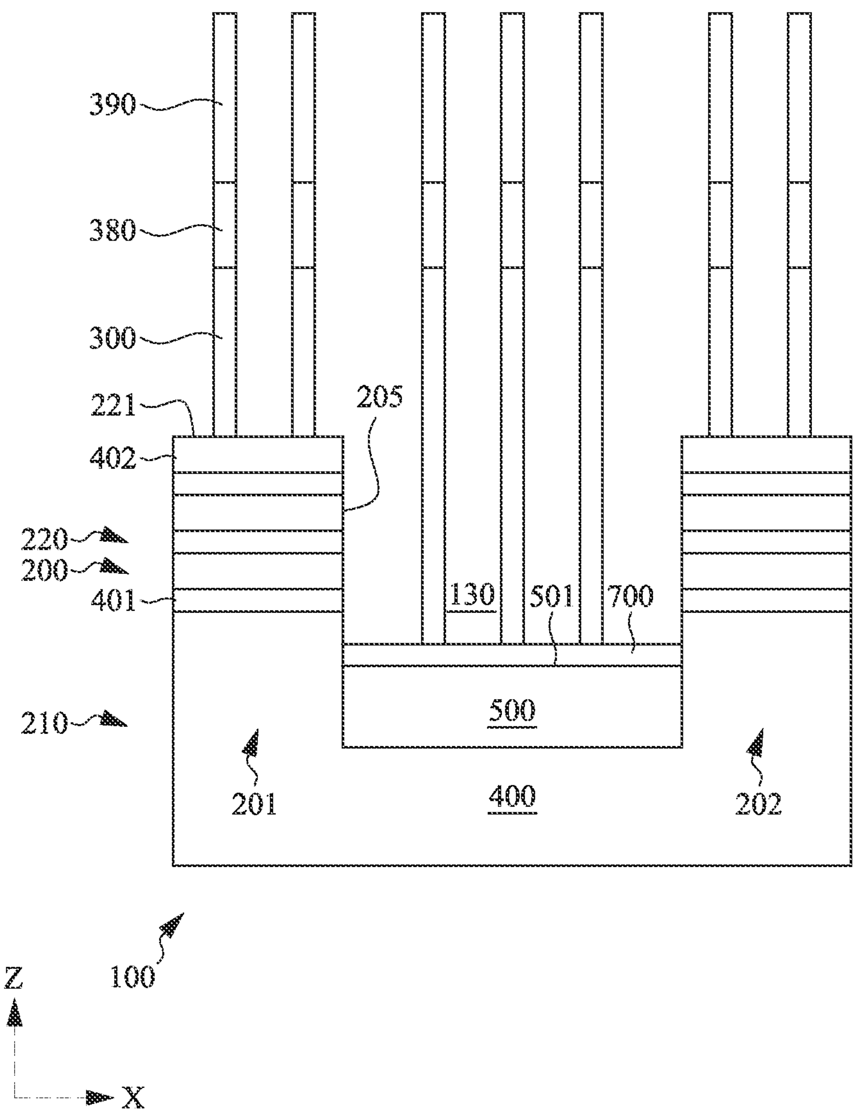

FIG. 15 illustrates the structure of the embodiment of FIGS. 13 and 14 after performing operations S816 and S818, such that the structure of FIG. 15 is at the same stage of fabrication as FIG. 2. Thus, FIG. 15 provides another embodiment of a semiconductor device 100 at the intermediate stage of fabrication of FIG. 1 is shown in a cross-sectional view, taken along line 2-2 in FIG. 1.

As shown in FIG. 15, the fins 200 are formed from an underlying semiconductor substrate 400 and from alternating semiconductor layers 401 and 402 formed over the semiconductor substrate 400. Thus, the fins 200 include a mesa portion 210 and nanosheet portion 220. Further, the fins 200 are formed with substantially vertical end walls 205. Also, the fins 200 have an uppermost surface 221.

The trench 130 extends from the end wall 205 of a first adjacent fin 201 to the end wall 205 of a second adjacent fin 202.

As shown in FIG. 15, a shallow trench isolation (STI) feature 500 is formed in the trench 130 and extends from the end wall 205 of the first adjacent fin 201 to the end wall 205 of the second adjacent fin 202. The STI feature 500 has an uppermost surface 501.

As shown in FIG. 15, a hard mask 700 is formed over the uppermost surface 501 of the STI feature 500, i.e., in the trench 130.

As shown in FIG. 15, sacrificial gates 300 are formed over the fins 200 and over the STI feature 500. Over the fins 200, the sacrificial gates 300 are located directly on the uppermost fin surface 221. Over the STI feature 500, the sacrificial gates 300 are located directly on the hard mask 700.

As shown in FIG. 15, a first gate mask 380 and second gate mask 390 may be located over the sacrificial gates 300.

Figure 16:
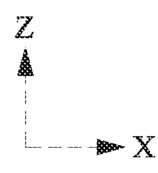
FIGS. 16-18 are cross-sectional views of the embodiments of the semiconductor device of FIGS. 15 and 2 at a successive stage of fabrication.
Figure 16:
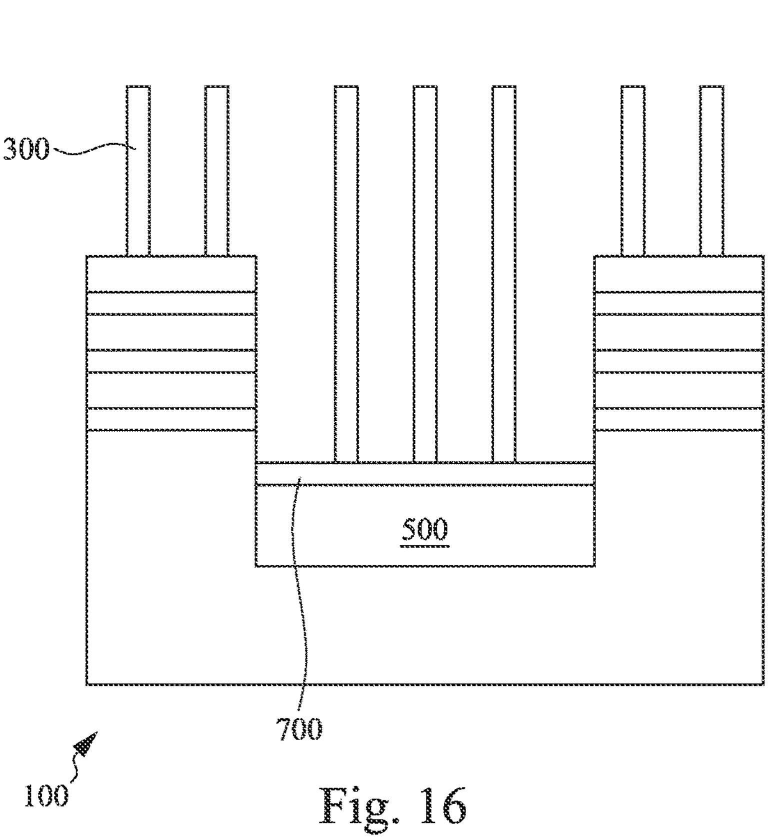
Figure 17:
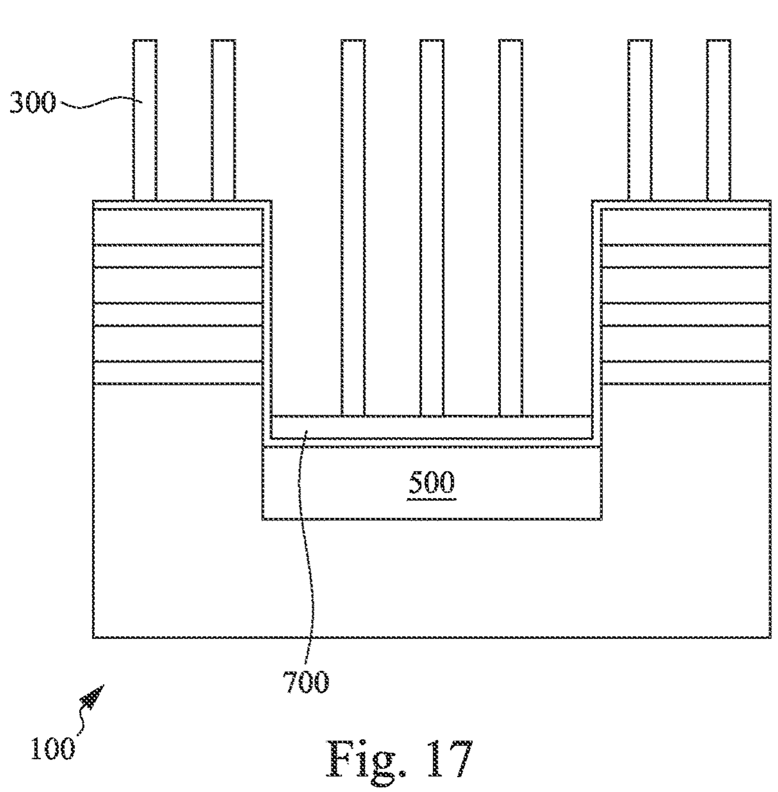

Referring now to FIGS. 16 and 17, cross-sectional views of the structures of FIGS. 15 and 2, respectively are illustrated after some further processing is performed. For example, a dilute HF clean/dry etch processing in an EPI loop may be performed. As shown, the hard mask 700 covers and protects the underlying STI feature 500. Thus, the sacrificial structures 300 overlying the STI feature 500 are not vulnerable to collapse.

In an embodiment, a method includes forming a shallow trench isolation (STI) feature; forming a mask layer over the STI feature; depositing a sacrificial material over the mask layer; and etching the sacrificial material to form sacrificial structures over the mask layer, wherein the mask layer prevents etching of the STI feature while etching the sacrificial material.

In certain embodiments, the method further includes forming a layer of oxide over the STI feature, wherein the mask layer is formed over the layer of oxide, and wherein the mask layer prevents etching of the layer of oxide while etching the sacrificial material.

In certain embodiments of the method, the mask layer includes a nitrogen-containing dielectric material.

In certain embodiments of the method, forming the shallow trench isolation (STI) feature includes etching a semiconductor material to form a cavity between adjacent active regions; and depositing isolation material in the cavity.

In certain embodiments of the method, forming the mask layer over the STI feature includes performing a nitridation process to form a nitridated layer from the STI feature, wherein the nitridated layer is the mask layer.

In certain embodiments of the method, forming the mask layer over the STI feature includes forming a dielectric layer over the STI feature; and performing a nitridation process to form a nitridated layer from the dielectric layer, wherein the nitridated layer is the mask layer.

In certain embodiments of the method, forming the mask layer over the STI feature includes depositing a nitrogen-containing dielectric material over the STI feature.

In certain embodiments of the method, forming the mask layer over the STI feature includes performing a nitridation process to form a nitridated layer, wherein the nitridation process is a nitrogen implant process performed with an energy of from 500 eV to 10 keV, with a dosage of from 1E15 to 1E17 atom/$cm^2$, and at a temperature of from −100 to 500° C.

In certain embodiments of the method, forming the mask layer over the STI feature includes performing a nitridation process to form a nitridated layer, wherein the nitridation process is a nitridation anneal process performed with an anneal gas selected from $NH_3$, $N_2$, $N_2$+$H_2$, $N_2O$, $NH_3$ radical, $N_2$ radical, $N_2$+$H_2$ radical, $N_2O$ radical or a mixture thereof, at a temperature of from 100 to 1400 C, and at a pressure of from 0.01 to 25 atm.

In another embodiment, a method includes etching a semiconductor material to form a cavity between adjacent active regions; depositing isolation material in the cavity to form a shallow trench isolation (STI) feature; forming a mask layer over the STI feature and over the adjacent active regions; removing the mask layer from over the adjacent active regions; depositing a sacrificial gate material over the mask layer over the STI feature and over the adjacent active regions; and etching the sacrificial gate material to form sacrificial gates over the mask layer over the STI feature and over the adjacent active regions, wherein the mask layer prevents etching of the STI feature while etching the sacrificial gate material.

In certain embodiments, the method further includes forming a layer of oxide over the STI feature and over the adjacent active regions, wherein the mask layer is formed over the layer of oxide, and wherein the sacrificial gates are formed over the layer of oxide.

In certain embodiments of the method, forming the mask layer over the STI feature and over the adjacent active regions includes performing a nitridation process to form a nitridated layer from the STI feature and from the adjacent active regions, wherein the nitridated layer is the mask layer.

In certain embodiments of the method, forming the mask layer over the STI feature and over the adjacent active regions includes forming a dielectric layer over the STI feature and over the adjacent active regions; and performing a nitridation process to form a nitridated layer from the dielectric layer, wherein the nitridated layer is the mask layer.

In certain embodiments of the method, forming the mask layer over the STI feature and over the adjacent active regions includes depositing a nitrogen-containing dielectric material over the STI feature and over the adjacent active regions.

In certain embodiments, the method further includes forming a stack of alternating semiconductor layers to form the semiconductor material before etching the semiconductor material to form the cavity between adjacent active regions.

In another embodiment, a semiconductor device includes a raised semiconductor region adjacent to a recessed semiconductor region; an isolation material located over the recessed semiconductor region; a hard mask layer located over the isolation material; and a dielectric layer located over the hard mask layer.

In certain embodiments, the device further includes a layer of oxide located over the isolation material and over the raised semiconductor region, wherein the hard mask layer is located over the layer of oxide.

In certain embodiments of the device, the hard mask layer is a nitridated layer of the isolation material.

In certain embodiments of the device, the hard mask layer is a nitridated layer of a dielectric material.

In certain embodiments of the device, the hard mask layer is a nitrogen-containing dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a shallow trench isolation (STI) feature;

forming a mask layer over the STI feature;

depositing a sacrificial material over the mask layer; and etching the sacrificial material to form sacrificial structures over the mask layer, wherein the mask layer prevents etching of the STI feature while etching the sacrificial material.

2. The method of claim 1, further comprising:

forming a layer of oxide over the STI feature, wherein the mask layer is formed over the layer of oxide, and wherein the mask layer prevents etching of the layer of oxide while etching the sacrificial material.

3. The method of claim 1, wherein the mask layer comprises a nitrogen-containing dielectric material.

4. The method of claim 1, wherein forming the shallow trench isolation (STI) feature comprises:

etching a semiconductor material to form a cavity between adjacent active regions; and depositing isolation material in the cavity.

5. The method of claim 1, wherein forming the mask layer over the STI feature comprises:

performing a nitridation process to form a nitridated layer from the STI feature, wherein the nitridated layer is the mask layer.

6. The method of claim 1, wherein forming the mask layer over the STI feature comprises:

forming a dielectric layer over the STI feature; and performing a nitridation process to form a nitridated layer from the dielectric layer, wherein the nitridated layer is the mask layer.

7. The method of claim 1, wherein forming the mask layer over the STI feature comprises:

depositing a nitrogen-containing dielectric material over the STI feature.

8. The method of claim 1, wherein forming the mask layer over the STI feature comprises:

performing a nitridation process to form a nitridated layer, wherein the nitridation process is a nitrogen implant process performed with an energy of from 500 eV to 10 keV, with a dosage of from 1E15 to 1E17 atom/cm2, and at a temperature of from-100 to 500° C.

9. The method of claim 1, wherein forming the mask layer over the STI feature comprises:

performing a nitridation process to form a nitridated layer, wherein the nitridation process is a nitridation anneal process performed with an anneal gas selected from $NH_3$, $N_2$, $N_2$+$H_2$, $N_2O$, $NH_3$ radical, $N_2$ radical, $N_2$+$H_2$ radical, $N_2O$ radical or a mixture thereof, at a temperature of from 100 to 1400 C, and at a pressure of from 0.01 to 25 atm.

10. A method comprising:

etching a semiconductor material to form a cavity between adjacent active regions;

depositing isolation material in the cavity to form a shallow trench isolation (STI) feature;

forming a mask layer over the STI feature and over the adjacent active regions;

removing the mask layer from over the adjacent active regions;

depositing a sacrificial gate material over the mask layer over the STI feature and over the adjacent active regions; and etching the sacrificial gate material to form sacrificial gates over the mask layer over the STI feature and over the adjacent active regions, wherein the mask layer prevents etching of the STI feature while etching the sacrificial gate material.

11. The method of claim 10, further comprising forming a layer of oxide over the STI feature and over the adjacent active regions, wherein the mask layer is formed over the layer of oxide, and wherein the sacrificial gates are formed over the layer of oxide.

12. The method of claim 10, wherein forming the mask layer over the STI feature and over the adjacent active regions comprises:

performing a nitridation process to form a nitridated layer from the STI feature and from the adjacent active regions, wherein the nitridated layer is the mask layer.

13. The method of claim 10, wherein forming the mask layer over the STI feature and over the adjacent active regions comprises:

forming a dielectric layer over the STI feature and over the adjacent active regions; and performing a nitridation process to form a nitridated layer from the dielectric layer, wherein the nitridated layer is the mask layer.

14. The method of claim 10, wherein forming the mask layer over the STI feature and over the adjacent active regions comprises:

depositing a nitrogen-containing dielectric material over the STI feature and over the adjacent active regions.

15. The method of claim 10, further comprising:

forming a stack of alternating semiconductor layers to form the semiconductor material before etching the semiconductor material to form the cavity between adjacent active regions.

16. A method comprising:

forming a shallow trench isolation (STI) feature between adjacent active semiconductor regions, the STI feature having an uppermost surface;

performing a nitridation process directly on the uppermost surface of the STI feature to convert a surface portion of the STI feature into a nitridated layer, wherein the nitridated layer is formed from material of the STI feature;

depositing a sacrificial gate material over the nitridated layer and over the adjacent active semiconductor regions; and etching the sacrificial gate material to form sacrificial gates, wherein the nitridated layer protects the STI feature from etching during etching of the sacrificial gate material.

17. The method of claim 16, wherein performing the nitridation process comprises:

performing the nitridation process on the uppermost surface of the STI feature and on uppermost surfaces and end walls of the adjacent active semiconductor regions to form the nitridated layer over the STI feature and over the adjacent active semiconductor regions; and removing the nitridated layer from over the uppermost surfaces and the end walls of the adjacent active semiconductor regions.

18. The method of claim 17, wherein the nitridation process is a nitrogen implant process performed with an energy of from 500 eV to 10 keV, a dosage of from $1\times10^{15}$ to $1\times10^{17}$ atoms/cm2, and at a temperature of from −100° C. to 500° C.

19. The method of claim 17, wherein the nitridation process is a nitridation anneal process performed with an anneal gas selected from $NH_3$, $N_2$, $N_2$+$H_2$, $N_2O$, $NH_3$ radical, $N_2$ radical, $N_2$+$H_2$ radical, $N_2O$ radical, or a mixture thereof, at a temperature of from 100° C. to 1400° C., and at a pressure of from 0.01 to 25 atm.

20. The method of claim 16, further comprising forming a stack of alternating first semiconductor layers and second semiconductor layers over a semiconductor material prior to forming the STI feature, wherein each of the adjacent active semiconductor regions comprises a bottom portion formed from the semiconductor material and an upper portion comprising the alternating first semiconductor layers and second semiconductor layers.

* * * * *